(12) United States Patent
Nakano et al.

(10) Patent No.: US 10,741,550 B2
(45) Date of Patent: Aug. 11, 2020

(54) REVERSE-CONDUCTING INSULATED GATE BIPOLAR TRANSISTOR

(71) Applicant: FUJI ELECTRIC CO., LTD., Kawasaki (JP)

(72) Inventors: Hayato Nakano, Kofu (JP); Keiichi Higuchi, Matsumoto (JP); Akihiro Osawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/362,165

(22) Filed: Mar. 22, 2019

(65) Prior Publication Data

US 2019/0355718 A1 Nov. 21, 2019

(30) Foreign Application Priority Data

May 18, 2018 (JP) .................................. 2018-95970

(51) Int. Cl.
  *H01L 27/07* (2006.01)
  *H01L 23/495* (2006.01)
  *H01L 29/417* (2006.01)
  *H01L 29/739* (2006.01)

(52) U.S. Cl.
  CPC .... *H01L 27/0716* (2013.01); *H01L 23/49562* (2013.01); *H01L 29/41708* (2013.01); *H01L 29/7395* (2013.01)

(58) Field of Classification Search
  None
  See application file for complete search history.

(56) References Cited

U.S. PATENT DOCUMENTS

| 6,809,348 | B1 | 10/2004 | Suzuki et al. |
| 7,589,412 | B2 * | 9/2009 | Kashimoto ............. H01L 24/97 |
| | | | 257/693 |
| 9,881,879 | B2 | 1/2018 | Inaba |
| 10,121,866 | B2 | 11/2018 | Naito |
| 10,297,533 | B2 * | 5/2019 | Kodaira .............. H01L 21/4803 |
| 10,332,845 | B2 * | 6/2019 | Yamada .................. H01L 24/05 |
| 2010/0264546 | A1 * | 10/2010 | Torii ....................... H01L 24/48 |
| | | | 257/773 |

(Continued)

FOREIGN PATENT DOCUMENTS

| JP | 8-330465 A | 12/1996 |
| JP | 2001-352066 A | 12/2001 |

(Continued)

*Primary Examiner* — Shaun M Campbell

(57) ABSTRACT

A reverse-conducting semiconductor device includes a semiconductor chip having a top surface, a first side and a second side orthogonal to the first side in a plan view, in which a plurality of transistor regions and a plurality of diode regions are alternately arranged and an upper-electrode is provided on top surface-sides of the transistor regions and the diode regions; and a wiring member having a flat-plate portion having a rectangular-shape which is metallurgically jointed to the upper-electrode via a joint member above the diode regions. The wiring member has a conductive wall rising from a bending edge of the flat-plate portion in a direction opposite to the upper-electrode, and the bending edge of the flat-plate portion is arranged parallel to the first side.

6 Claims, 9 Drawing Sheets

(56) References Cited

U.S. PATENT DOCUMENTS

| | | | |
|---|---|---|---|
| 2011/0278643 A1* | 11/2011 | Sato | H01L 23/367 257/140 |
| 2015/0097281 A1* | 4/2015 | Adachi | H01L 23/473 257/714 |
| 2017/0236908 A1 | 8/2017 | Naito | |
| 2017/0263535 A1* | 9/2017 | Nakano | H01L 23/48 |
| 2017/0271275 A1 | 9/2017 | Inaba | |

FOREIGN PATENT DOCUMENTS

| | | |
|---|---|---|
| JP | 2004-363328 A | 12/2004 |
| JP | 2008-300528 A | 12/2008 |
| JP | 2017-147435 A | 8/2017 |
| JP | 2017-168792 A | 9/2017 |

\* cited by examiner

FIG. 3
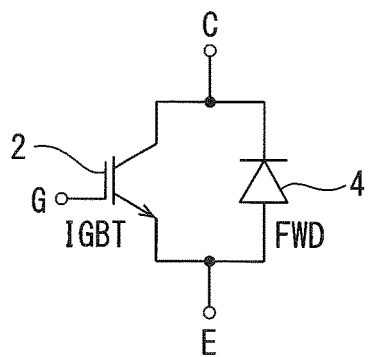
FIG. 4
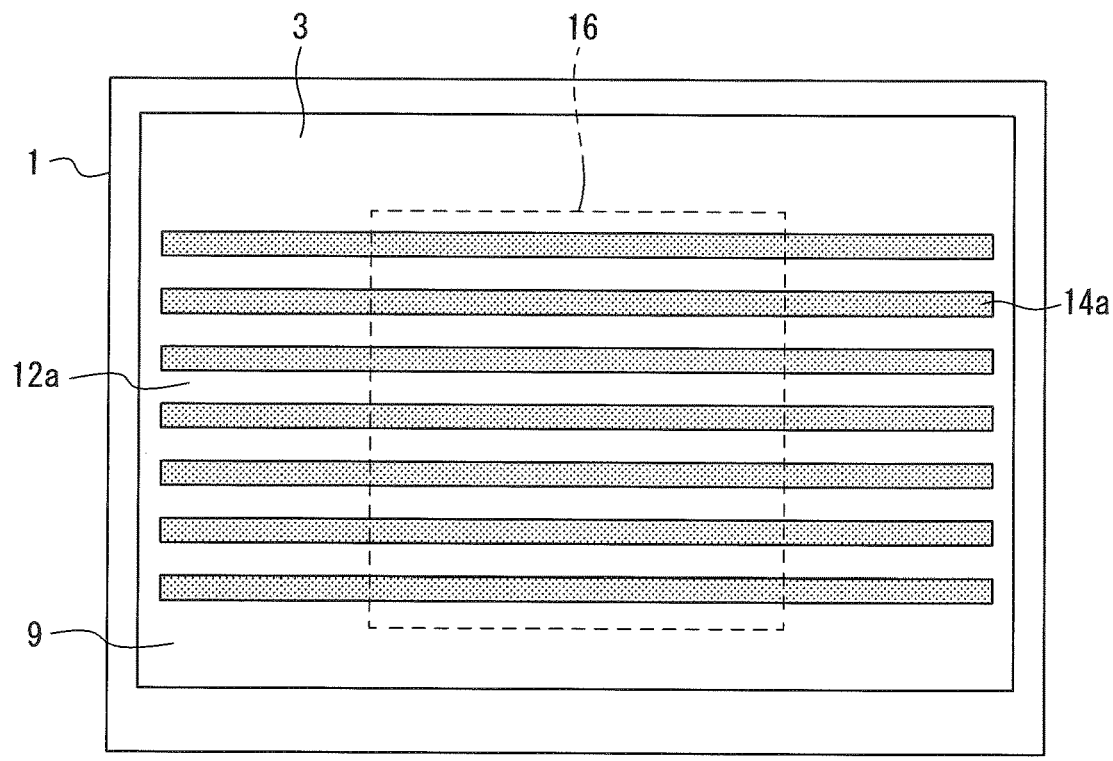
FIG. 5
| CHARACTERISTICS | LEAD FRAME | WIRE BONDING |
|---|---|---|
| CONTACT AREA | 13.1 | 1 |
| FWD ACTIVE REGION | 1 | 1 |
| FWD $I^2t$ CAPABILITY | 1.3 | 1 |

| ENERGIZATION | MAXIMUM DEFORMATION (m) | |
|---|---|---|
| | SEMICONDUCTOR DEVICE 200 | SEMICONDUCTOR DEVICE 300 |
| FWD | $1.03 \times 10^{-5}$ | $5.43 \times 10^{-5}$ |
| IGBT | $2.15 \times 10^{-5}$ | $1.94 \times 10^{-4}$ |

| ENERGIZATION | MAXIMUM DEFORMATION (m) | |
|---|---|---|
| | SEMICONDUCTOR DEVICE 100 | SEMICONDUCTOR DEVICE 400 |
| FWD | $4.13 \times 10^{-6}$ | $5.73 \times 10^{-6}$ |
| IGBT | $2.50 \times 10^{-5}$ | $3.30 \times 10^{-5}$ |

REVERSE-CONDUCTING INSULATED GATE BIPOLAR TRANSISTOR

CROSS REFERENCE TO RELATED APPLICATIONS

This application is based upon and claims the benefit of priority from the prior Japanese Patent Application No. P2018-095970 filed on May 18, 2018, the entire contents of which are incorporated herein by reference.

BACKGROUND OF THE INVENTION

1. Field of the Invention

The present invention relates to a reverse-conducting semiconductor device in which a switching element, such as an insulated gate bipolar transistor (IGBT) and the like, and a protection diode of the switching element are integrated monolithically on a single semiconductor chip.

2. Description of the Related Art

In the reverse-conducting IGBT (RC-IGBT), an IGBT as a switching element and a protection diode of the IGBT, the protection diode is implemented by a flyback diode or a freewheeling diode (FWD), are merged in a single semiconductor chip (see JP2017-168792A, JP2008-300528A, JP2017-147435A, and JP2004-363328A). An emitter electrode of the RC-IGBT is connected to an external-connection terminal by a wiring member, such as a bonding wire, a lead frame and the like.

When an active short-circuit failure of the FWD occurs, a thermal-breakdown tolerance of the reverse-conducting semiconductor device, such as the RC-IGBT and the like, may be determined by a current-squared-time product, or an $I^2t$, capability. The $I^2t$ capability of the FWD depends on a mechanical cooling capability of the FWD, which is a protection diode. Increasing an active area of the FWD can improve the $I^2t$ capability. However, increasing the active area of the FWD, or the protection diode, increases a chip size.

Further, in the power reverse-conducting semiconductor device, in order to safely and stably operate, it is necessary to efficiently dissipate heat generated during applying current. In JP2001-352066A and JPH08-330465A, a possibility of the cooling performance by the structural member of the IGBT is suggested. However, there is no description on the thermal-breakdown tolerance of the RC-IGBT when current is applied to the FWD.

SUMMARY OF THE INVENTION

An aspect of the present invention inheres in a semiconductor device, including: (a) a semiconductor chip having a top surface, a first side and a second side orthogonal to the first side in a plan view, in which a plurality of transistor regions and a plurality of diode regions are alternately arranged and an upper-electrode is provided above the top surface of the semiconductor chip, covering an area, in which the transistor regions and the diode regions are provided; and (b) a wiring member having a flat-plate portion having a rectangular-shape, which is metallurgically jointed to the upper-electrode via a joint member above the diode regions; wherein the transistor regions, each of which has a stripe-shape extending in parallel to the first side in the plan view, implement main current paths for conducting main current in a direction perpendicular to the top surface of the semiconductor chip, the diode regions, each of which has a stripe-shape extending parallel to the first side in the plan view, implement flyback paths for conducting reverse current in a direction perpendicular to the top surface of the semiconductor chip, and the wiring member has a conductive wall rising from a bending edge of the flat-plate portion in a direction opposite to the upper-electrode, and the bending edge of the flat-plate portion is arranged parallel to the first side.

BRIEF DESCRIPTION OF THE DRAWINGS

FIG. 3 is a circuit diagram illustrating an RC-IGBT used in the reverse-conducting semiconductor device according to the embodiment;

FIG. 4 is a top view illustrating an example of a reverse-conducting semiconductor device;

FIG. 5 is a table illustrating examples of withstand capabilities of a lead frame and a wire bonding in the reverse-conducting semiconductor device;

DETAILED DESCRIPTION

Figure 1:
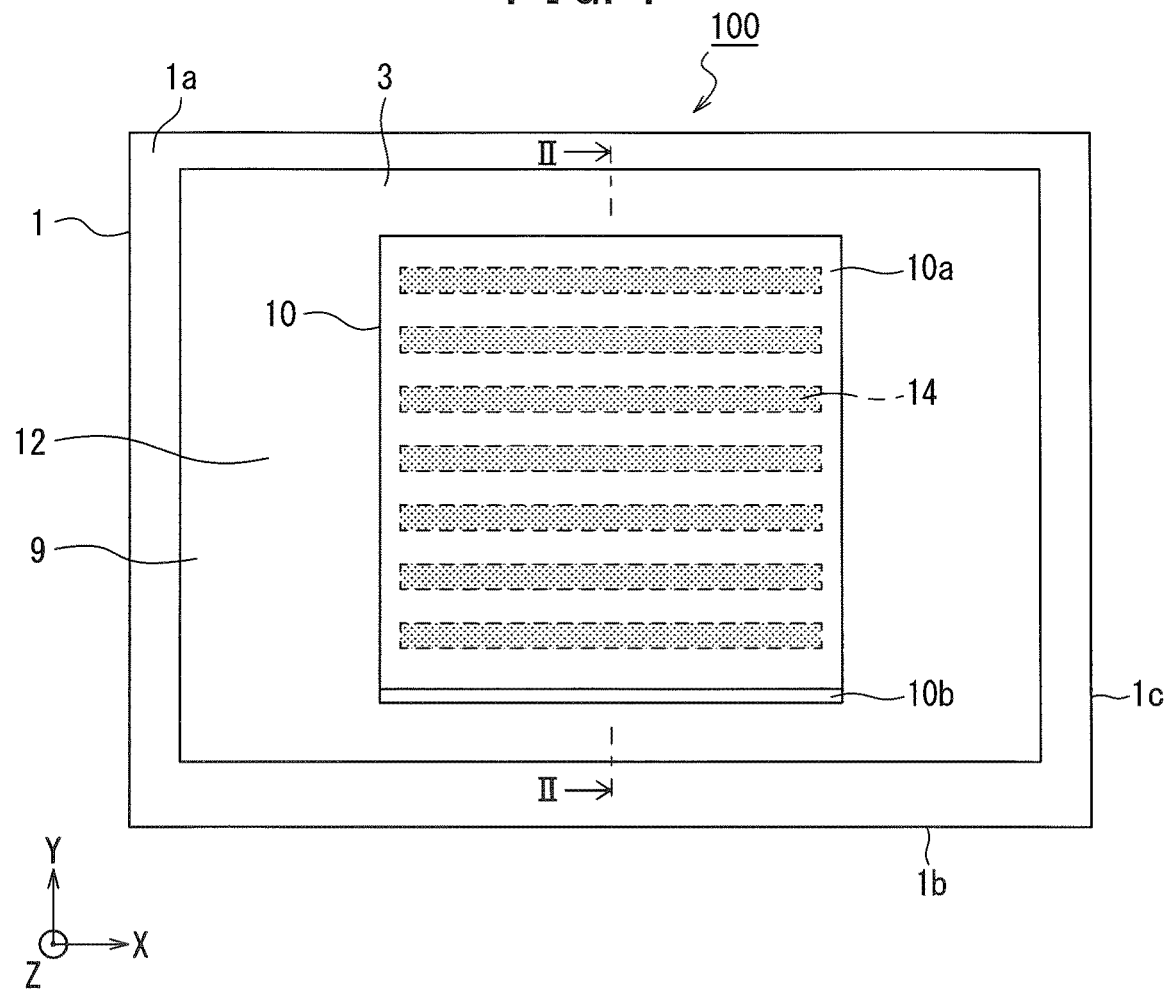
FIG. 1 is a top view illustrating an example of a reverse-conducting semiconductor device according to an embodiment of the present invention.

Herein after, an embodiment of the present invention will be described below. In the following description of the drawings, the same or similar parts are denoted by the same or similar reference numerals. However, it should be noted that the drawings are schematic, the relationship between the thickness and the planar dimension, the ratio of the thickness of each device and each member, etc. may be different from the actual one. Therefore, specific thicknesses and dimensions should be determined with reference to the following description. In addition, it should also be understood that the respective drawings are illustrated with the dimensional relationships and proportions different from each other.

Further, in the following descriptions, the terms relating to directions, such as "left and right" and "top and bottom" are merely defined for illustration purposes, and thus, such definitions do not limit the technical spirit of the present invention. Therefore, for example, when the paper plane is rotated by 90 degrees, the "left and right" and the "top and bottom" are read in exchange. When the paper plane is rotated by 180 degrees, the "left" is changed to the "right", and the "right" is changed to the "left". In the following description, the case where the first conductivity type is p type and the second conductivity type is n type will be described as an example. However, the conductivity type may be selected in an inverse relationship so that the first conductivity type may be n type and the second conductivity type may be p type. In addition, + or − attached to p or n means that the semiconductor region is relatively high or low in impurity concentration as compared with the semiconductor region to which + and − are not added. However, even semiconductor regions labeled with the same p do not mean that the impurity concentrations of the respective semiconductor regions are strictly the same.

Embodiment

Figure 2:
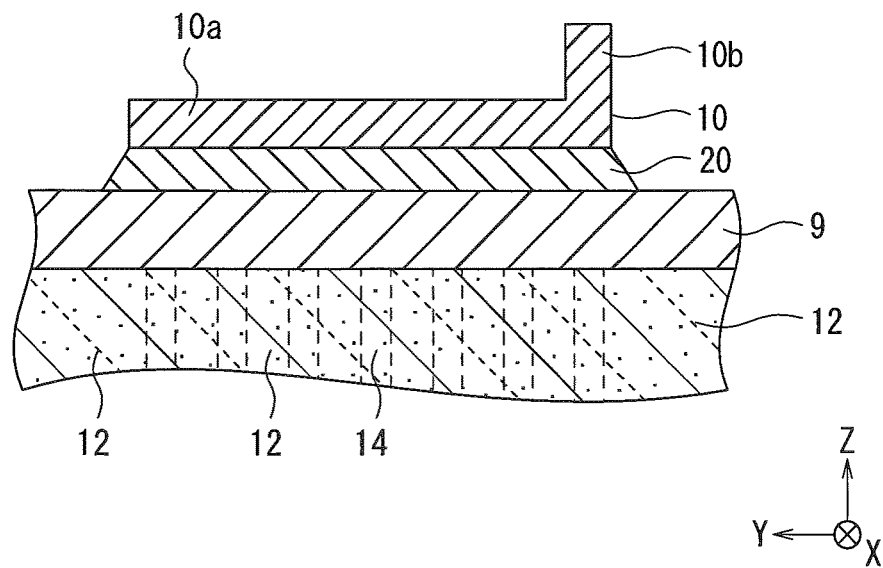
FIG. 2 is a schematic cross-sectional view of the reverse-conducting semiconductor device as seen from the direction of the line II-II in FIG. 1.

As illustrated in FIG. 1, a reverse-conducting semiconductor device 100 according to an embodiment of the present invention includes a semiconductor chip 1 and a wiring member 10. The semiconductor chip 1 has a top surface 1a, a first side 1b, and a second side 1c orthogonal to the first side 1b in a plan view. As illustrated in FIG. 2, a plurality of transistor regions 12 and a plurality of diode regions 14 are alternately arranged at least below the wiring member 10 in the semiconductor chip 1. An upper-electrode 9 is provided on top surfaces of the transistor regions 12 and the diode regions 14. As illustrated in FIG. 1, the semiconductor chip 1 may be in a rectangular-shape in a plan view, and lengths of the first side 1b and the second side 1c may be equal, or the first side 1b may be longer than the second side 1c.

The reverse-conducting semiconductor device 100, which is illustrated in an equivalent circuit of FIG. 3, may be an RC-IGBT in which an IGBT as a switching element 2 and an FWD as a protection diode 4 for conducting a reverse current of the switching element 2 are integrated monolithically on a single chip. In the representation of the equivalent circuit of FIG. 3, although it is comprehensively illustrated by a single element, the actual layout inside the semiconductor chip 1 has a multi-channel structure.

In an active region 3 inside the semiconductor chip 1, a plurality of main current paths through the transistor regions 12 and a plurality of flyback paths, or reverse-current paths through the diode regions 14 are alternately arranged, and are arranged in a direction perpendicular to the paper surface of FIG. 1, which is assigned as a Z-axis direction. The transistor regions 12 have a multi-channel structure by which a plurality of the main current paths extends in the Z-axis direction, while the plan view of each of the main current paths is delineated as a stripe-shape. Each of the longer sides of the stripes implementing the transistor regions 12 extends in parallel to the first side 1b in the plan view.

The diode regions 14 are also in a stripe-shape in the plan view. Each of the longer sides of the stripes implementing the diode regions 14 extends in parallel to the first side 1b in the plan view. A plurality of reverse current flows in the Z-axis direction via the diode regions 14 which implement the protection diode 4. That is, the stripe-shaped diode regions 14 are provided so as to form a multi-channel structure.

In FIG. 1 and the like, a right-hand rule XYZ-coordinate system is illustrated for the sake of convenience, the top surface of the semiconductor chip 1 is arranged in parallel to the X-Y plane, and the top surface of the semiconductor chip 1 coincides with the positive direction of the Z-axis. In the present specification, "in the plan view" means a case where the top surface of the semiconductor chip 1 is viewed from the positive direction of the Z-axis.

In the reverse-conducting semiconductor device 100, the transistor regions 12 are implemented by patterns of a plurality of channel regions of the vertical IGBTs merged in a thickness direction of the semiconductor chip 1, that is, a direction perpendicular to the top surface of the semiconductor chip 1, or the Z-axis direction. Similarly, in the reverse-conducting semiconductor device 100, the diode regions 14 implement the vertical FWDs merged in the thickness direction of the semiconductor chip 1. The longer sides of the stripe-shaped patterns of the main current paths and the flyback paths extend in parallel to each other in the direction of the first side 1b, or X-axis direction, of the semiconductor chip 1 illustrated in FIG. 1 in the plan view. In the reverse-conducting semiconductor device 100, silicon (Si) may be used as a semiconductor material of the semiconductor chip 1. However, the semiconductor material is not limited to Si, and for example, a wide bandgap semiconductor material which has a wider forbidden bandwidth than 1.1 eV of Si, such as silicon carbide (SiC) and the like, can be used. Although illustration is omitted, peripheral circuits, such as a sense circuit, a protection circuit, a control circuit, and the like, and a gate pad may be provided in a periphery of the active region 3.

On a top surface of the active region 3, an upper-electrode 9, which shall be assigned as an "emitter electrode" in the case of IGBT, of the switching element 2 is provided. The upper-electrode 9 is electrically connected to a main electrode region, which is an "emitter region" in the case of IGBT, of the switching element 2. The upper-electrode 9 is made of a conductive layer, such as a metallic layer and the like. As can be understood from FIG. 3, the upper-electrode 9 is further electrically connected to an anode region of the protection diode 4. Although the illustration is omitted in FIG. 2, on a bottom surface of the active region 3, a lower-electrode, which shall be assigned as a "collector electrode" in the case of IGBT, of the switching element 2 is provided. And the lower-electrode is electrically connected to the other main electrode region, which is a "collector region" in the case of IGBT, of the switching element 2. As can be understood from FIG. 3, the lower-electrode is further electrically connected to a cathode region of the protection diode 4. Although illustration is omitted, the lower-electrode is also made of a conductive layer, such as a metal layer and the like, but it is not necessary to be made of the same material as the upper-electrode 9.

In the transistor regions 12 of the reverse-conducting semiconductor device 100, a main current flows in the direction perpendicular to a principal surface of the semiconductor chip 1 between the upper-electrode 9 and the lower-electrode through the channel regions serving as main current paths. Similarly, in the reverse-conducting semiconductor device 100 according to the embodiment, the reverse-current flows between the upper-electrode 9 and the lower-electrode via the diode regions 14 in a direction perpendicular to the main surface. The direction of the reverse-current is opposite to the main current of the transistor regions 12. The upper-electrode 9 electrically connects the main current paths and the flyback paths.

The wiring member 10 having a flat-plate portion 10a is metallurgically jointed to the upper-electrode 9 via a joint member 20, as illustrated in FIG. 2. As illustrated in FIG. 1, the flat-plate portion 10a has a rectangular-shape, and the flat-plate portion 10a is jointed to the upper-electrode 9 at a location disposed at least over the diode region 14. As illustrated in FIG. 2, the wiring member 10 includes a flat-plate portion 10a facing the upper-electrode 9 so as to sandwich the joint member 20 and to be metallurgically jointed to the upper-electrode 9, and a conductive wall 10b rising perpendicularly toward the opposite direction against the upper-electrode 9, or rising along the positive direction of the Z-axis. One of the edges of the flat-plate portion 10a may be arranged in parallel to the first side 1b of the semiconductor chip 1 as illustrated in FIG. 1. In the semiconductor chip 1 below the flat-plate portion 10a, the flyback paths through the diode regions 14 and the main current paths through the transistor regions 12 are alternately arranged in a stripe-shape.

For the wiring member 10, a lead frame made of copper (Cu), aluminum (Al) or the like, a metallic plate, a metallic foil and the like may be used. The flat-plate portion 10a and the conductive wall 10b may be formed by metal stamping. An angle between the flat-plate portion 10a and the conductive wall 10b may be approximately 90 degrees or may be an obtuse angle. In the plan view, the flat-plate portion 10a may be in a trapezoid-shape as well as a rectangle-shape, or may have a shape with chamfered corners. A width in the X-axis direction and a width in the Y-axis direction of the flat-plate portion 10a may be the same or the width in the X-axis direction may be larger than the width in the Y-axis direction. The conductive wall 10b may be connected to all of the edges of the flat-plate portion 10a or may be connected to a part of the edges. Although illustration is omitted, the wiring member 10 may be metallurgically connected to another circuit in the semiconductor device 100, or may be electrically connected to an external circuit. For the joint member 20, an alloy material, such as solder and the like, may be used.

<$I^2t$ Capability>

FIG. 4 illustrates another structure of the RC-IGBT in the semiconductor chip 1. Although not illustrated in the figure, representation of an equivalent circuit similar to that in FIG. 3 is also possible for the RC-IGBT illustrated in FIG. 4. In the planar pattern of FIG. 4, the longer sides of the stripe-shaped diode regions 14a extend to the edges of the active region 3 alternately with the stripe-shaped main current paths of the IGBT areas 12a, or the stripe-shaped transistor regions. A bonding wire or a lead frame is supposed to be electrically connected to the semiconductor chip 1 illustrated in FIG. 4.

When the wiring member, such as the lead frame and the like, and the bonding wire are brought into contact with a region 16 indicated by the broken line in FIG. 4, a contact area of the wiring member can be increased compared to the bonding wire. For example, as illustrated in a table of FIG. 5, assuming that a contact area of the bonding wire is one, the contact area of the lead frame increases by 13.1 times. In the table of FIG. 5, a total area occupied by the diode regions 14a in the active region 3 indicated as an "FWD active region" has the same area in the lead frame and the bonding wire. In the table of FIG. 5, the $I^2t$ capability of the protection diode 4 indicated as an "FWD $I^2t$ capability" is higher by 1.3 times in the lead frame than in the bonding wire. Thus, in the lead frame, since a heat-radiation area increases due to an increase in the contact area, the $I^2t$ capability may improve.

Figure 6:
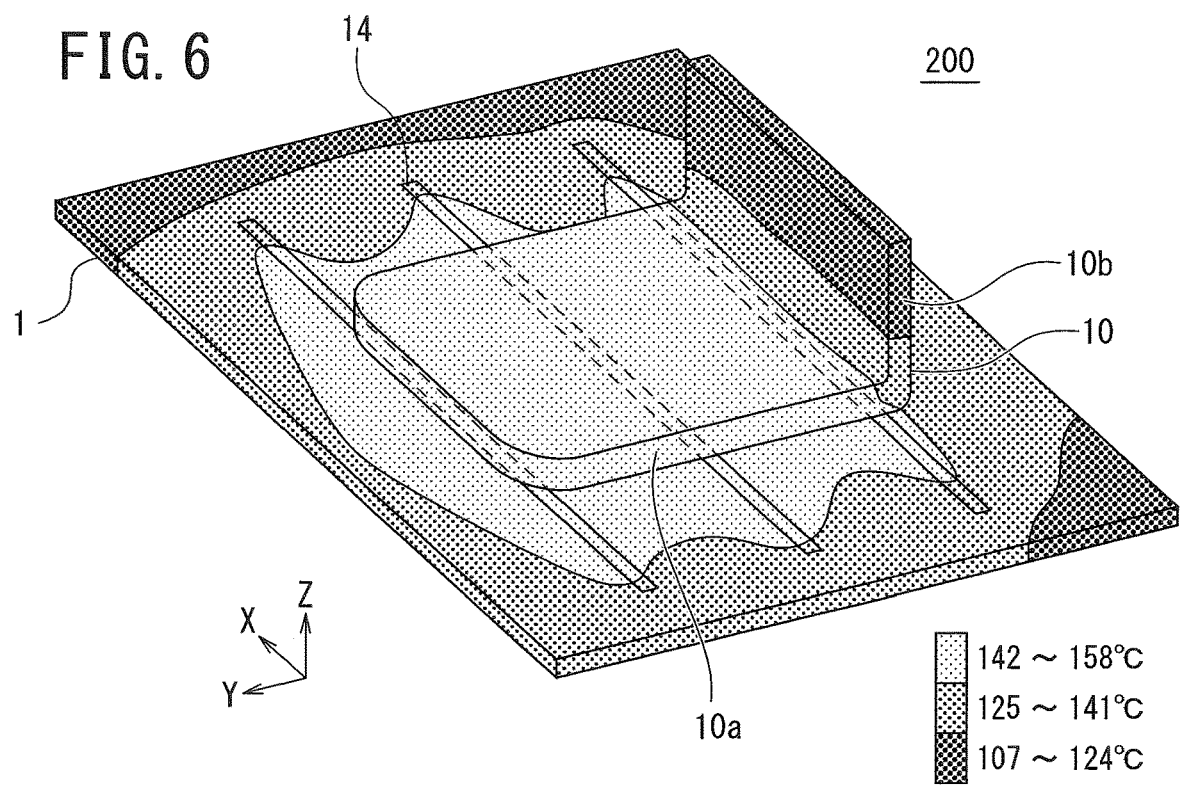
FIG. 6 is a perspective view illustrating an example of a simulation result of heat generation of a reverse-conducting semiconductor device according to a comparative example of the embodiment.

Simulation has been conducted on heat generation during current flow in the protection diode 4. The simulation has been executed using ANSYS (registered trademark in USPTO) software for finite element analysis. FIG. 6 illustrates an arrangement structure of a plurality of diode regions 14a implementing a reverse-conducting semiconductor device 200, which is the RC-IGBT, according to a comparative example of the embodiment. In a planar pattern, as the longer sides of the stripe-shaped diode regions 14a extends towards the edges of the semiconductor chip 1, the outer portions of the stripe-shaped diode regions 14a protrude from an area of a joint region occupied by the flat-plate portion 10a of the wiring member 10, and reaches to an area disposed at an outside of the joint region in the reverse-conducting semiconductor device according to the comparative example of the embodiment. As illustrated in FIG. 6, an area of the higher temperature portion in a range of 142 to 158 degrees Celsius extends outside the joint region occupied by the flat-plate portion 10a of the wiring member 10. In the simulation, the semiconductor chip 1 has been in a rectangular-shape, a length of the longer side has been about 18 millimeters, and a length of the shorter side has been about 13 millimeters. A thickness has been about 90 micrometers. A width of the flat-plate portion 10a in the X-axis direction has been about 6.5 millimeters, a width in the Y-axis direction has been about seven millimeters, and a thickness has been about 0.7 millimeters.

Figure 7:
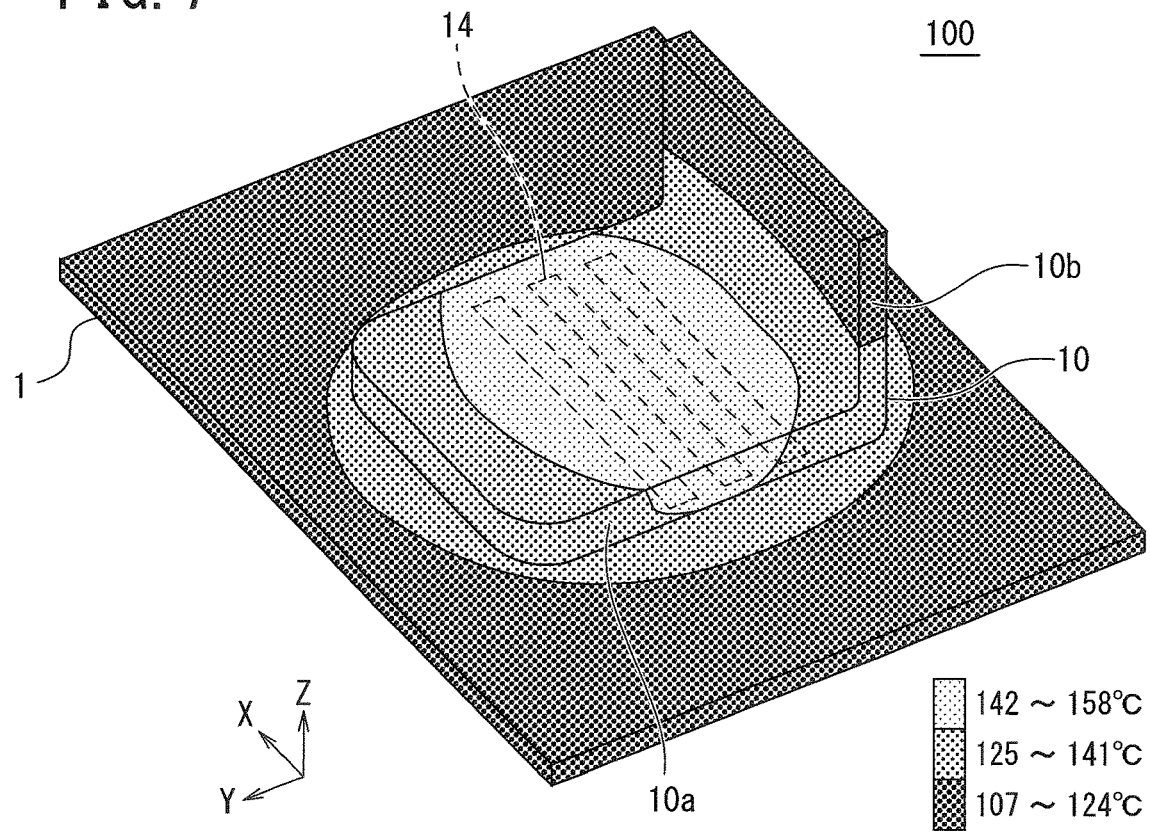
FIG. 7 is a perspective view illustrating an example of another simulation result of heat generation of the reverse-conducting semiconductor device according to the embodiment.

On the other hand, FIG. 7 illustrates an arrangement structure of the diode regions 14 embedded in the reverse-conducting semiconductor device 100, which is the RC-IGBT, according to the embodiment. In the reverse-conducting semiconductor device 100, the diode regions are limited within the joint region occupied by the flat-plate portion 10a so that the entire area of the diode regions 14 is covered with the wiring member 10. That is, the entire area of the diode regions 14 is covered with the flat-plate portion 10a in the plan view of the reverse-conducting semiconductor device according to the embodiment.

In the plan view, the total area occupied by the diode regions 14 of the reverse-conducting semiconductor device 100 is the same as the total area occupied by the diode regions 14a of the reverse-conducting semiconductor device 200. As illustrated in FIG. 7, the higher temperature portion in the range of 142 to 158 degrees Celsius falls within the joint region occupied by the flat-plate portion 10a of the wiring member 10. That is, since the diode regions 14 are arranged in the joint region occupied by the flat-plate portion 10a, heat generated in the diode regions 14 when the reverse current flows through the protection diode 4 may be absorbed by the wiring member 10. As a result, in the reverse-conducting semiconductor device 100 according to the embodiment, it is possible to increase the $I^2t$ capability and to secure reliability by improving the thermal-breakdown tolerance.

As mentioned above, in the reverse-conducting semiconductor device 100 according to the embodiment, by arranging the patterns of the diode regions 14 only in the joint region occupied by the flat-plate portion 10a, it is possible to suppress the increase of the temperature when heat is generated in the diode regions 14. As a result, the $I^2t$ capability of the reverse-conducting semiconductor device 100 can be increased according to the embodiment. For example, a plurality of the diode regions 14 may be combined into a single square-shaped area instead of a plurality of stripes. Cooling of the diode region formed in the square-shape when the heat is generated may be possible in the same manner as in the case of the stripe-shaped diode regions 14, but cooling capability at the time of heating of the switching device 2, or the IGBT, may conflict with cooling capability of the diode regions 14. Since the transistor regions 12 disposed below the wiring member 10 is not provided between the diode regions 14, cooling in the heat generation when the main current flows in the switching element 2 becomes insufficient. Therefore, in view of the cooling capability when the main current flows in the switching element 2, it is preferable to alternately arrange the diode regions 14 and the main current paths through the transistor regions 12 in the stripe-shape as illustrated in FIG. 7.

In the plan view, the total area occupied by the diode regions 14, which is covered with the wiring member 10, is preferably 20 percent or more and 60 percent or less, more preferably 25 percent or more and 50 percent or less, with respect to the area of the flat-plate portion 10a of the wiring member 10. The total area occupied by the diode regions 14 in the lower region of the wiring member 10 is preferably 20 percent or more with respect to the area of the flat-plate portion 10a in order to ensure the cooling capability when the reverse current flows through the protection diode 4. In addition, as the total area occupied by the diode regions 14 is increased, the area of the transistor regions 12 decreases accordingly. The characteristics of the RC-IGBT is determined by the balance of installation areas of the protection diode 4 and the switching element 2, or IGBT. Increasing the area occupied by the protection diode 4 inside the semiconductor chip 1 and decreasing the area occupied by the switching element 2, or IGBT, causes an increase in on-resistance. Therefore, the total area occupied by the diode regions 14 in the lower region of the wiring member 10 is desirably 60 percent or less with respect to the area of the flat-plate portion 10a. An area ratio and a pitch between the transistor regions 12 and the diode regions 14 arranged in the active region 3 of the semiconductor chip 1 may be determined in consideration of desired device characteristics other than heat generation during applying current.

<Mechanical Deformation Amount>

Figure 8:
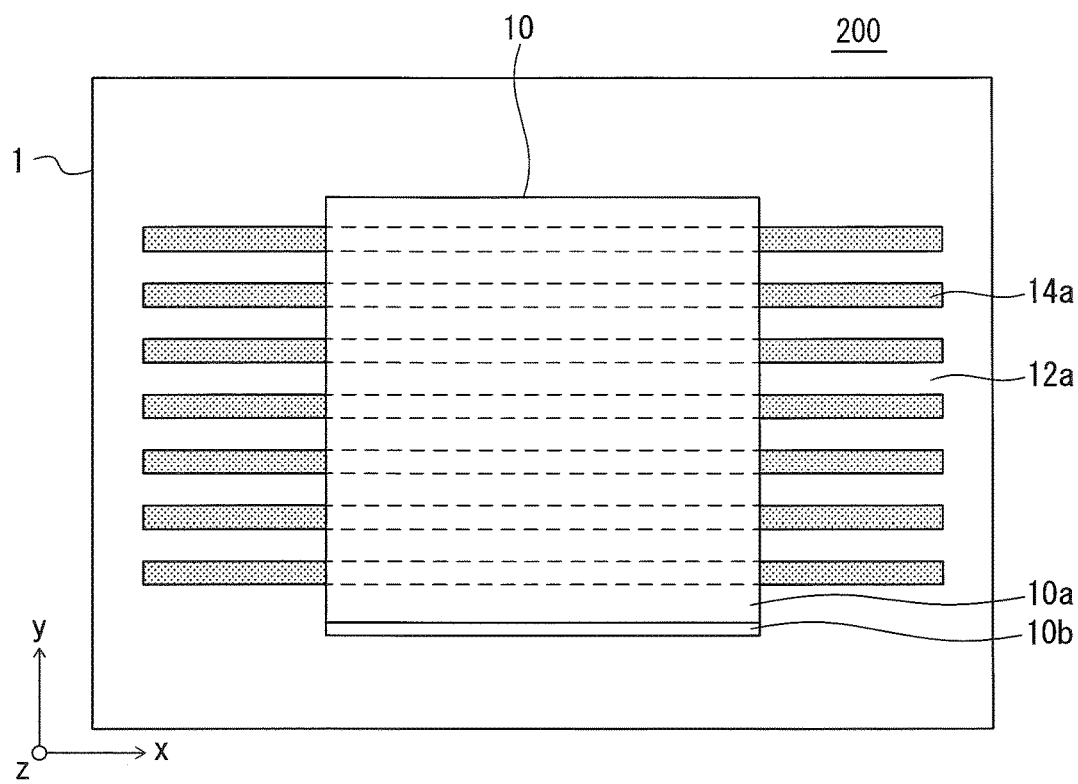
FIG. 8 is a top view illustrating an example of arrangement of a wiring member for a diode region in the reverse-conducting semiconductor device according to the embodiment.

FIG. 8 illustrates the reverse-conducting semiconductor device 200 in which a bending edge of the flat-plate portion 10a of the wiring member 10 is arranged in parallel to the extending direction, that is the X-axis direction, of the stripe pattern of the diode regions 14a. The conductive wall 10b is perpendicularly connected to the bending edge of the flat-plate portion 10a. Namely, in the structure illustrated in FIG. 8, a direction of a principal surface of the conductive wall 10b rising perpendicularly from the flat-plate portion 10a of the wiring member 10 is arranged in parallel with the extending direction of the longer side of the stripe pattern of the diode regions 14a.

Figure 9:
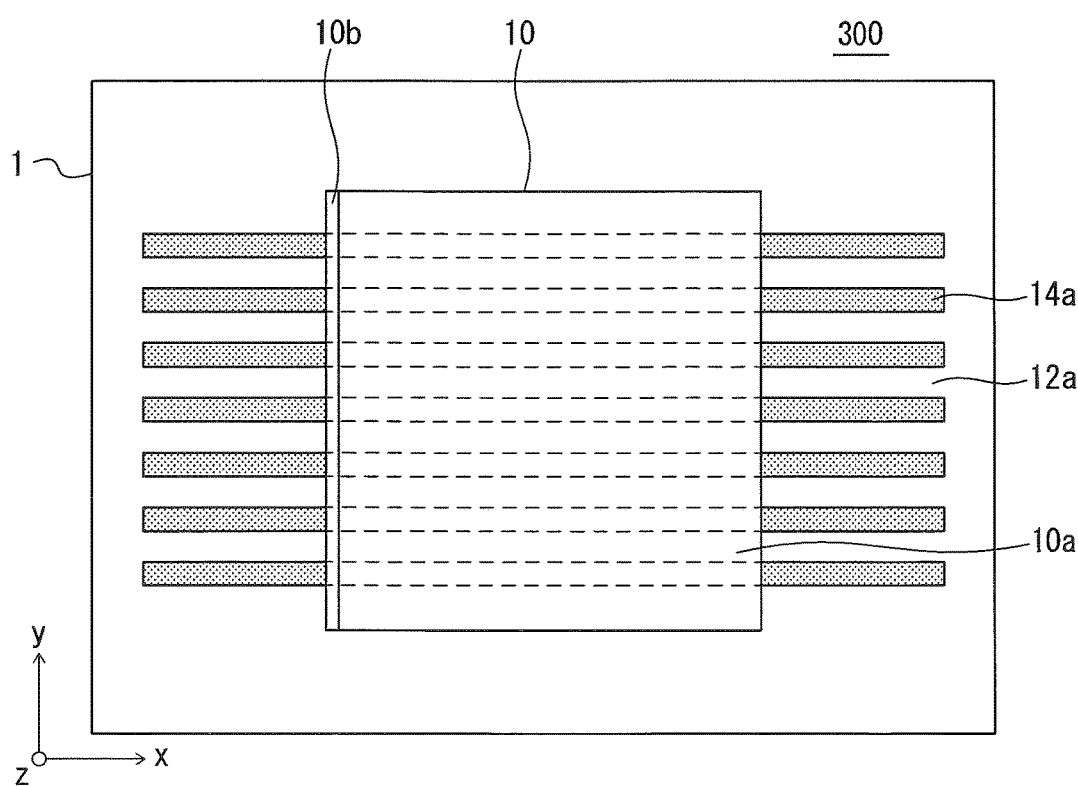
FIG. 9 is a top view illustrating an arrangement of a wiring member for the diode region in the reverse-conducting semiconductor device according to another comparative example of the embodiment.

Moreover, FIG. 9 illustrates a reverse-conducting semiconductor device 300 according to another comparative example of the embodiment, in which the bending edge of the flat-plate portion 10a of the wiring member 10 is arranged in a direction orthogonal to the extending direction of the longer side of the stripe pattern of the diode regions 14a. In FIG. 9, the X-axis direction is the longer-side direction of the flat-plate portion 10a of the wiring member 10, and the Y-axis direction is the shorter-side direction of the flat-plate portion 10a. The direction of the principal surface of the conductive wall 10b of the wiring member 10 is orthogonal to the extending direction of the longer side of the stripe pattern of the diode regions 14a. In FIG. 9, the edge of the conductive wall 10b when viewed from above the wiring member 10, which is a direction perpendicular to the principal surface of the flat-plate portion 10a, or the Z-axis direction, is illustrated in a long and narrow rectangular-shape in which a longer-side direction of the rectangular-shape is a direction orthogonal to the extending direction of the longer side of the stripe pattern of the diode portion 14a.

Figure 10:
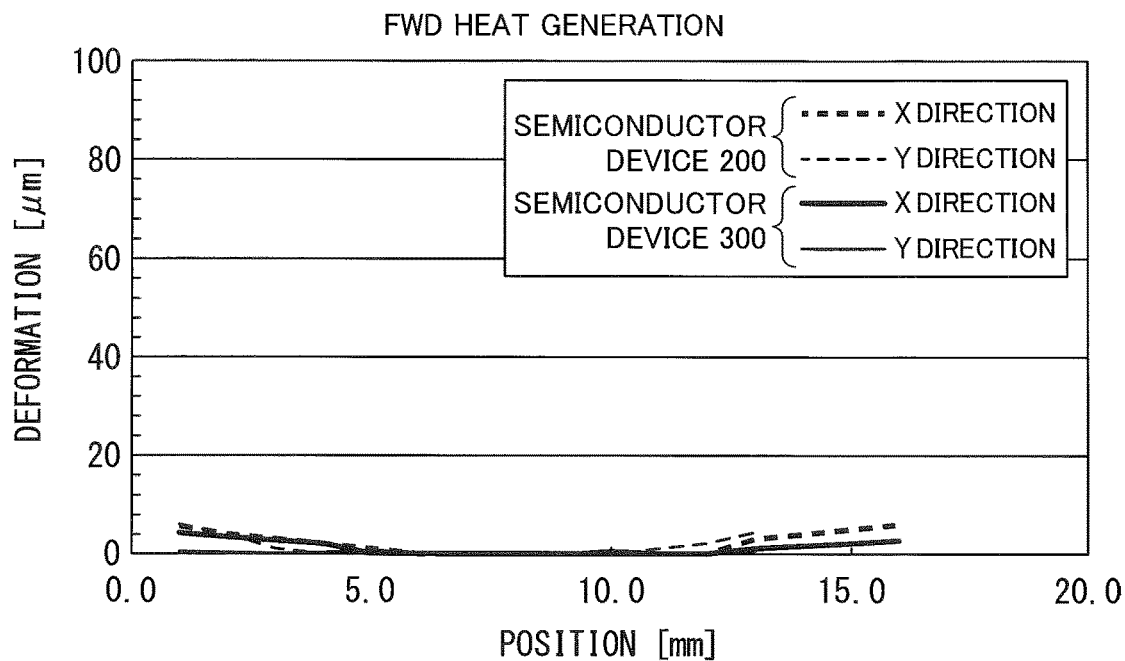
FIG. 10 is a graph illustrating examples of simulation results of deformation amounts in a case where a protection diode (FWD) has generated heat in the arrangement of the wiring member illustrated in FIG. 8.
Figure 11:
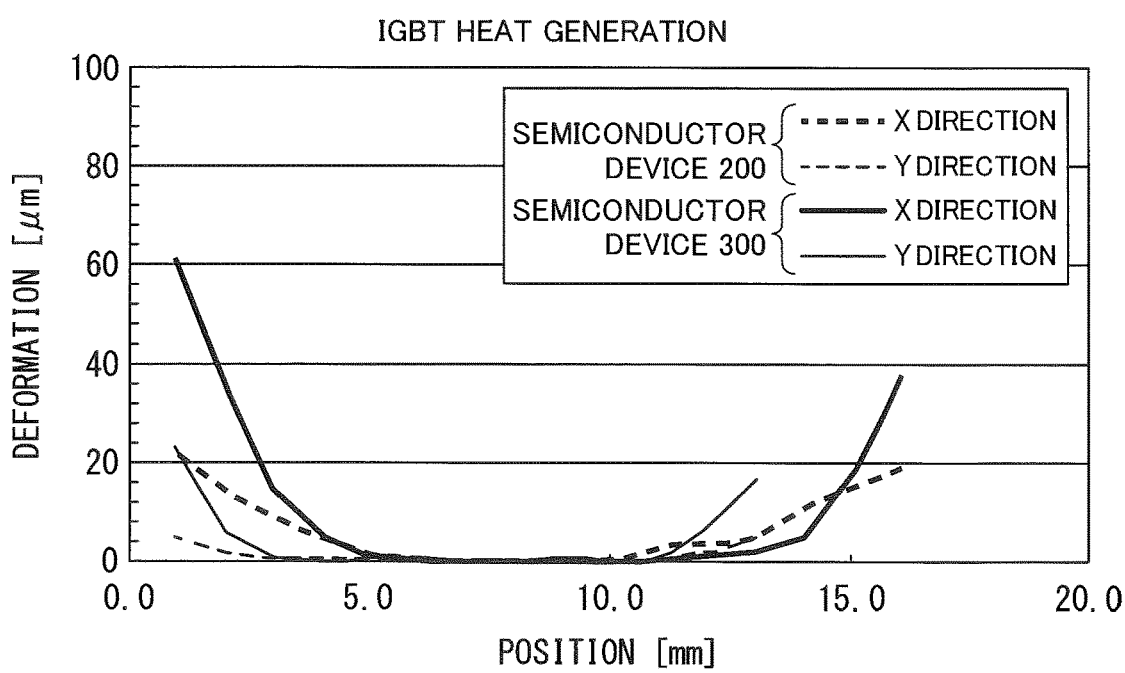
FIG. 11 is a graph illustrating examples of simulation results of deformation amounts in a case where the switching element (IGBT) has generated heat in the arrangement of the wiring member illustrated in FIG. 9.
Figures 12, 13:
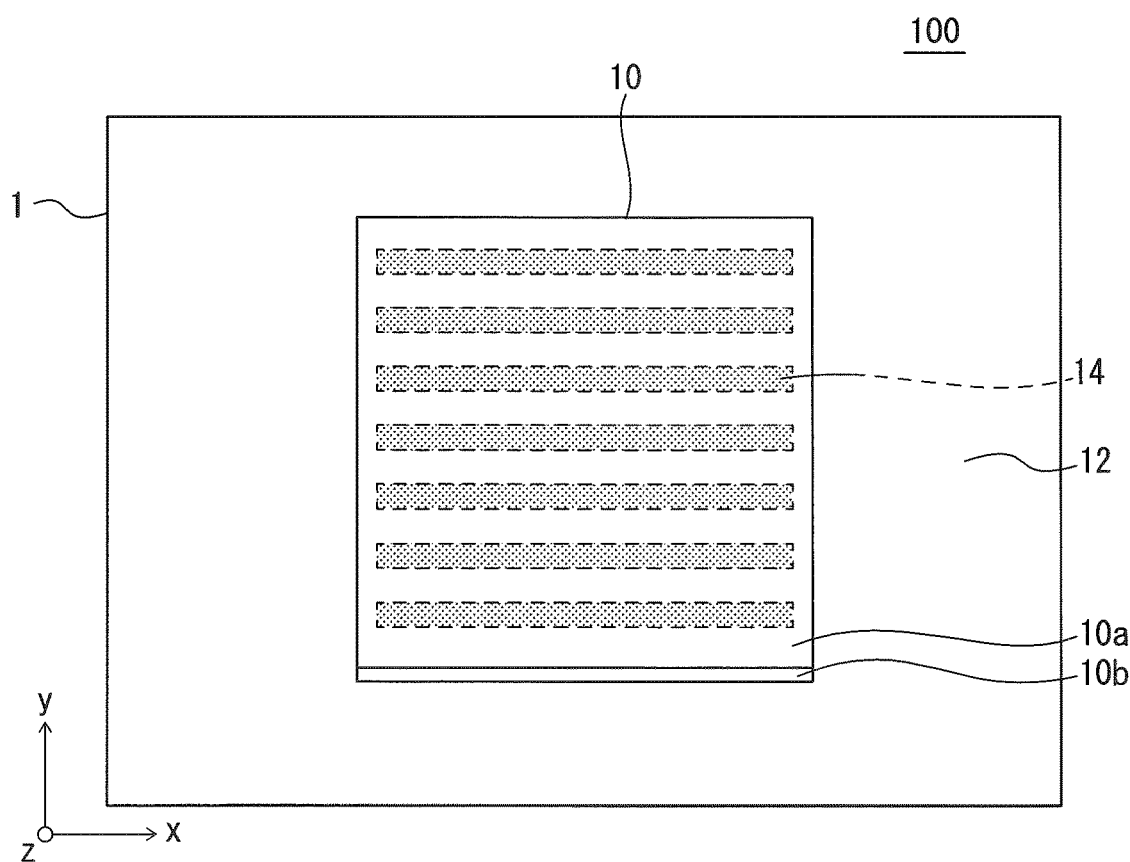
FIG. 12 is a table illustrating examples of maximum deformation amounts of the simulation results illustrated in FIGS. 10 and 11.
FIG. 13 is a top view illustrating an example of arrangement of a wiring member for the diode region in the reverse-conducting semiconductor device according to an embodiment.

FIG. 10 is a graph illustrating simulation results for amounts of deformation of the chip 1 using ANSYS (registered trademark in USPTO) software, due to heat generated when the reverse current flows through the protective diode 4 in the reverse-conducting semiconductor devices 200 illustrated in FIG. 8 according to the embodiment, and the amounts of deformation of the chip 1 in the reverse-conducting semiconductor devices 300 according to another comparative example of the embodiment illustrated in FIG. 9. FIG. 11 is a graph illustrating simulation results for amounts of deformation of the chip 1 using ANSYS (registered trademark in USPTO) software, due to heat generated when the main current flows through the switching element 2 in the reverse-conducting semiconductor devices 200 illustrated in FIG. 8 according to the embodiment, and the amounts of deformation of the chip 1 in the reverse-conducting semiconductor devices 300 according to another comparative example of the embodiment illustrated in FIG. 9. In FIGS. 10 and 11, broken lines illustrate the deformations of the reverse-conducting semiconductor device 200 according to the embodiment, and solid lines illustrate the deformations of the reverse-conducting semiconductor device 300 according to the another comparative example. The thick broken line and the thick solid line indicate the deformations along the line extending through the center of the semiconductor chip 1 and extending in the X-axis direction. The thin broken line and the thin solid line indicate the deformations along the line extending through the center of the semiconductor chip 1 and extending in the Y-axis direction. FIG. 12 illustrates a maximum value of the deformation in a plane of the semiconductor chip 1 due to heat generation during energization of each of the reverse-conduction semiconductor devices 200 and 300, as a "maximum deformation". In a table of FIG. 12, the upper row presents the maximum deformations when the reverse current flows through the protection diode 4 and the lower row presents the maximum deformations when the main current flows through the switching element 2. Since the position in the plane of the chip 1 where the maximum deformation is obtained does not necessarily correspond to the measurement position in FIG. 10 or FIG. 11, the maximum values of the deformations in the graphs of FIGS. 10 and 11 may be different from the maximum values of the deformations illustrated in the table of FIG. 12.

FIG. 10 illustrates the simulation result of the amount of deformation of the chip 1 due to heat generation when the reverse current flows through the protection diode 4. In the case of the reverse-conducting semiconductor device 200 in which the bending edge of the flat-plate portion 10a of the wiring member 10 is arranged in parallel to the extending direction of the longer side of the stripe pattern of the diode regions 14a as illustrated in the graph of FIG. 10 and the table of FIG. 12, the maximum deformation is about 10 micrometers. On the other hand, in the case of the reverse-conducting semiconductor device 300 according to the another comparative example, in which the bending edge of the flat-plate portion 10a is arranged in a direction orthogonal to the extending direction of the longer side of the stripe pattern of the diode regions 14a, the maximum deformation is 50 micrometers or more. As mentioned above, by arranging the direction of the principal surface of the conductive wall 10b in parallel with the extending direction of the longer side of the stripe pattern of the diode regions 14a, the maximum deformation of the semiconductor chip 1 can be reduced. And, similar to the topology illustrated in FIG. 7, if the flat-plate portion 10a has a rectangular shape defined by shorter sides and longer sides, by arranging the direction of the shorter side of the flat-plate portion 10a in parallel with the extending direction of the longer side of the stripe pattern of the diode regions 14a, the maximum deformation of the semiconductor chip 1 can be reduced.

FIG. 11 illustrates the simulation result of the amount of deformation of the chip 1 due to heat generation when the main current flows through the switching element 2. As illustrated in the graph of FIG. 11 and the table of FIG. 12, in the case of the reverse-conducting semiconductor device 200 in which the bending edge of the flat-plate portion 10a is arranged in parallel to the extending direction of the longer side of the stripe pattern of the diode regions 14a, the maximum deformation is about 20 micrometers. On the other hand, in the case of the reverse-conducting semiconductor device 300 in which the bending edge of the flat-plate portion 10a is arranged in a direction orthogonal to the extending direction of the longer side of the stripe pattern of the diode regions 14a, the maximum deformation is about 190 micrometers. As mentioned above, by arranging the bending edge of the flat-plate portion 10a and the principal surface of the conductive wall 10b in parallel to the extending direction of the longer side of the stripe pattern of the diode regions 14a, the maximum deformation of the semiconductor chip 1 can be reduced.

FIG. 13 illustrates the reverse-conducting semiconductor device 100 according to the embodiment, in which the bending edge of the flat-plate portion 10a having the rectangular-shape is arranged in parallel to the extending direction, or the X-axis direction, of the stripe pattern of the diode regions 14. The direction of the principal surface of the conductive wall 10b of the wiring member 10 is arranged in parallel to the extending direction of the longer side of the stripe pattern of the diode regions 14. In the reverse-conducting semiconductor device 100, the diode region 14 is formed only under the flat-plate portion 10a in the plan view.

Figure 14:
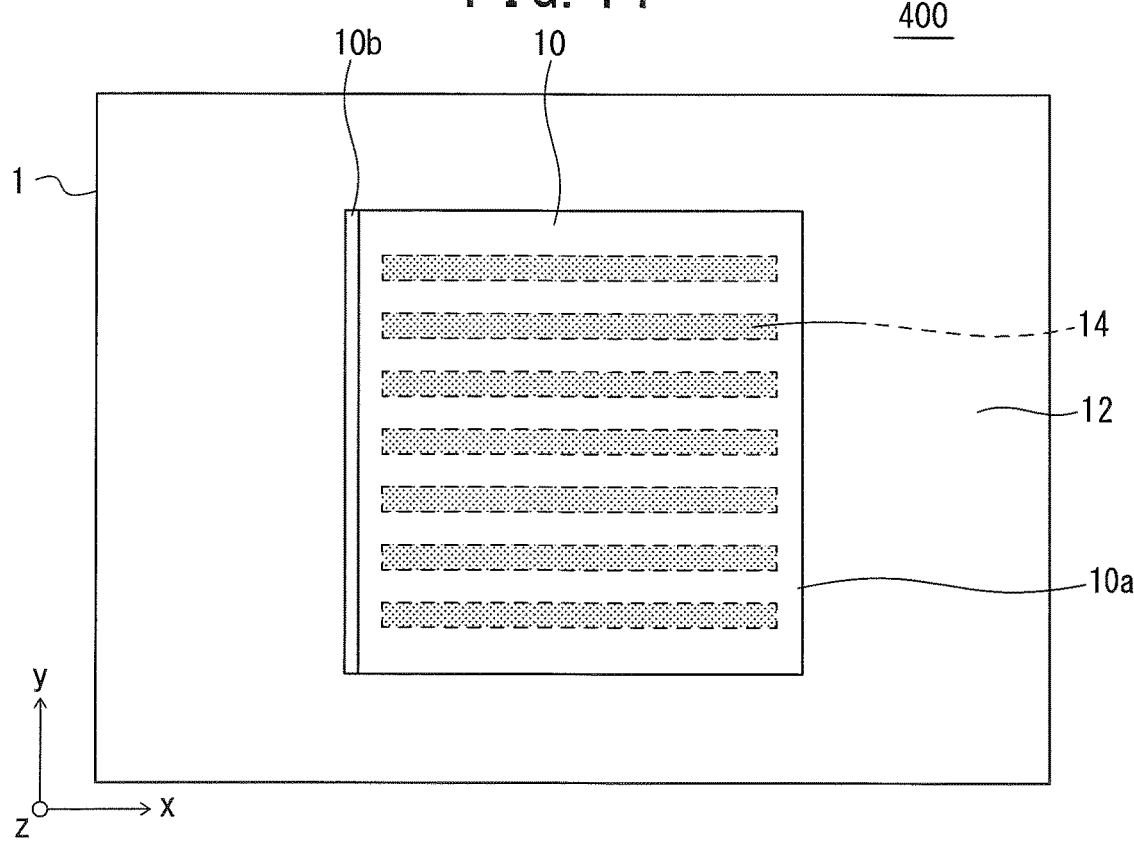
FIG. 14 is a top view illustrating an arrangement of the wiring member for the diode region in the reverse-conducting semiconductor device according to a still another comparative example of the embodiment.

Moreover, FIG. 14 illustrates a plan view of a reverse-conducting semiconductor device 400 according to a still another comparative example of the embodiment, in which the bending edge of the flat-plate portion 10a having the rectangular-shape is arranged in a direction orthogonal to the extending direction of the longer side of the stripe pattern of the diode regions 14. The direction of the principal surface of the conductive wall 10b is orthogonal to the extending direction of the longer side of the stripe pattern of the diode regions 14. In the reverse-conducting semiconductor device 400, the diode regions 14 are formed only under the flat-plate portion 10a in the plan view.

Figure 15:
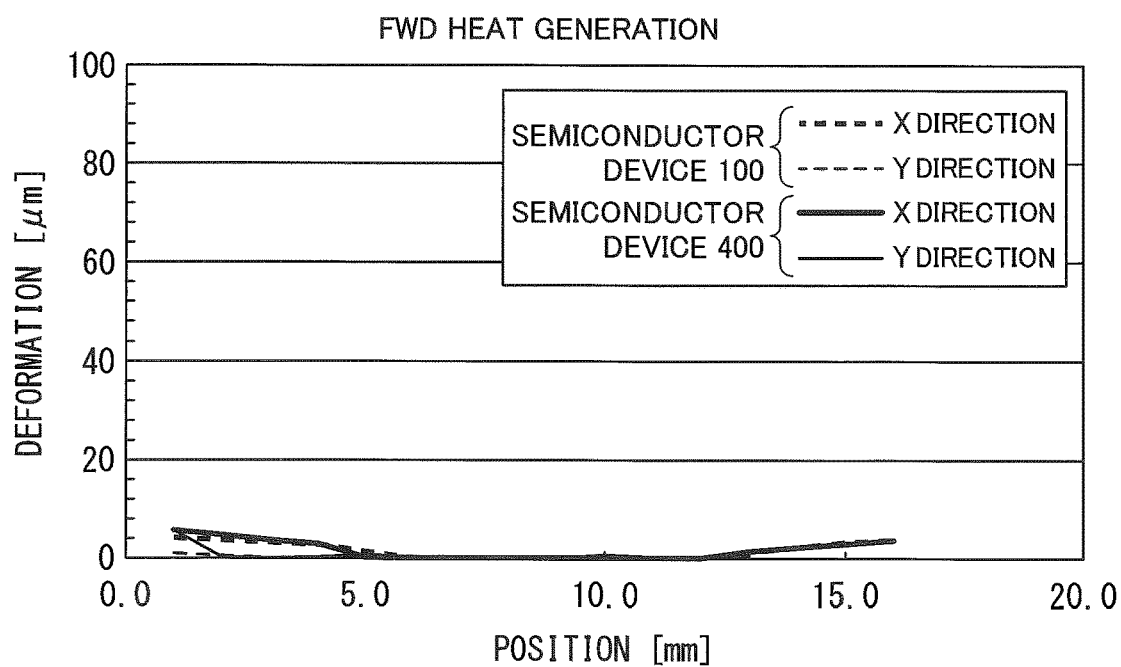
FIG. 15 is a table illustrating examples of simulation results of deformation amounts when the protection diode (FWD) has generated heat in the arrangement of the wiring member illustrated in FIG. 13.
Figures 16, 17:
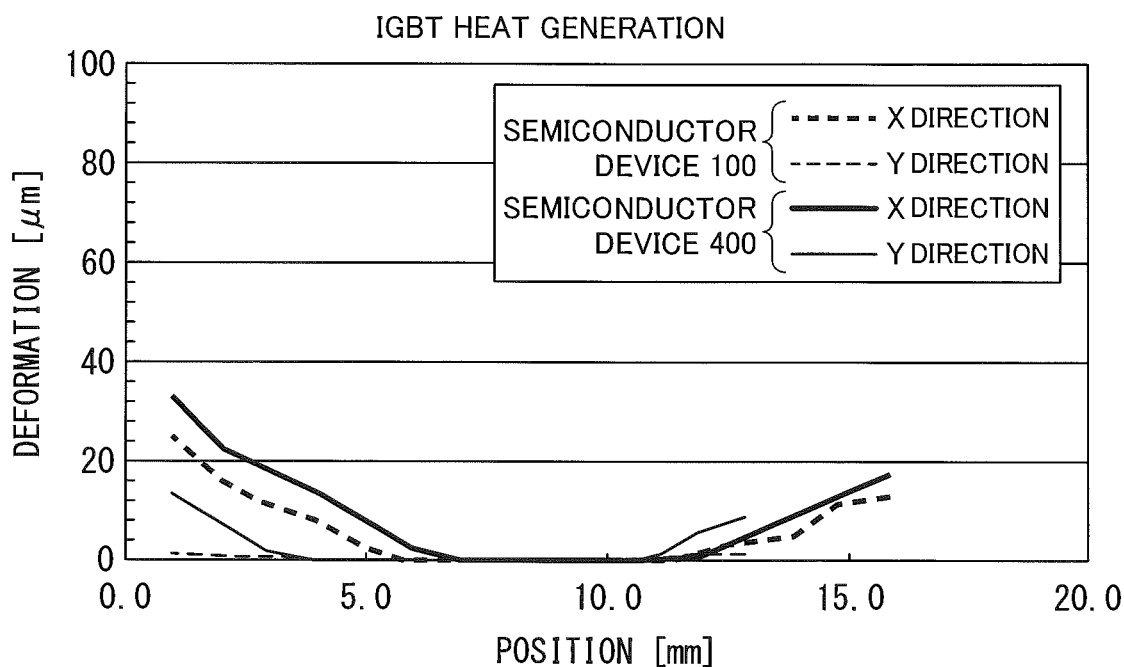
FIG. 16 is a table illustrating examples of simulation results of deformation amounts when the switching element (IGBT) has generated heat in the arrangement of the wiring member illustrated in FIG. 14.
FIG. 17 is a table illustrating examples of maximum deformation amounts of the simulation results illustrated in FIGS. 15 and 16.

FIG. 15 is a graph illustrating simulation results of the deformation amount of the chip 1 using ANSYS (registered trademark in USPTO) software, due to the heat generated when the reverse current flows through the protection diode 4, with respect to the reverse-conduction semiconductor device 100 according to the embodiment illustrated in FIG. 13, and the reverse-conduction semiconductor device 400 according to the still another comparative example of the embodiment illustrated in FIG. 14, respectively. FIG. 16 is a graph illustrating simulation results of the deformation amount of the chip 1 using ANSYS (registered trademark in USPTO) software, due to the heat generated when the main current flows through the switching element 2, with respect to the reverse-conduction semiconductor devices 100 and 400 illustrated in FIGS. 13 and 14, respectively. In FIGS. 15 and 16, broken lines illustrate the deformations of the reverse-conducting semiconductor device 100, and solid lines illustrate the deformations of the reverse-conducting semiconductor device 400. The thick broken line and the thick solid line indicate the deformations along the line extending through the center of the semiconductor chip 1 and extending in the X-axis direction. The thin broken line and the thin solid line indicate the deformation amounts along the line extending through the center of the semiconductor chip 1 and extending in the Y-axis direction. FIG. 17 illustrates a maximum value of the deformation in a plane of the semiconductor chip 1 due to heat generation during energization of each of the reverse-conducting semiconductor devices 100 and 400, as a "maximum deformation". In the table of FIG. 17, the upper row presents the maximum deformation when the reverse current flows through the protection diode 4 and the lower row presents the maximum deformation when the main current flows through the switching element 2. Since the position in the plane of the chip 1 where the maximum deformation amount is obtained does not necessarily correspond to the measurement position in FIG. 15 or FIG. 16, the maximum values of the deformation in the graphs of FIGS. 15 and 16 may be different from the maximum value in the table of FIG. 17.

FIG. 15 illustrates the simulation result of the amount of deformation of the chip 1 due to heat generation when the reverse current flows through the protection diode 4. As illustrated in the graph of FIG. 15 and the table of FIG. 17, in the case of the reverse-conducting semiconductor device 100 in which the bending edge of the flat-plate portion 10a is arranged in parallel to the extending direction of the longer side of the stripe pattern of the diode regions 14, the maximum deformation is about four micrometers. On the other hand, in the case of the reverse-conducting semiconductor device 400 in which the bending edge of the flat-plate portion 10a is arranged in a direction orthogonal to the extending direction of the longer side of the stripe pattern of the diode regions 14, the maximum deformation is about six micrometers. As mentioned above, by arranging the bending edge of the flat-plate portion 10a and the principal surface of the conductive wall 10b in parallel with the extending direction of the longer side of the stripe pattern of the diode regions 14, the maximum deformation of the semiconductor chip 1 can be reduced.

FIG. 16 illustrates the simulation result of the amount of deformation of the chip 1 due to heat generation during applying current to the switching element 2. As illustrated in the graph of FIG. 16 and the table of FIG. 17, in the case of the reverse-conducting semiconductor device 100 in which the bending edge of the flat-plate portion 10a is arranged in parallel to the extending direction of the longer side of the stripe pattern of the diode regions 14, the maximum deformation is about 25 micrometers. On the other hand, in the case of the reverse-conducting semiconductor device 400 in which the bending edge of the flat-plate portion 10a is arranged in a direction orthogonal to the extending direction of the longer side of the stripe pattern of the diode regions 14, the maximum deformation is about 33 micrometers. As mentioned above, by arranging the bending edge of the flat-plate portion 10a and the principal surface of the conductive wall 10b in parallel with the extending direction of the longer side of the stripe pattern of the diode regions 14, the maximum deformation of the semiconductor chip 1 can be reduced.

Furthermore, as illustrated in the tables of FIGS. 12 and 17, the maximum deformations of the reverse-conducting semiconductor devices 100, 200 are reduced as compared with the reverse-conducting semiconductor devices 300, 400. In particular, in the reverse-conducting semiconductor device 100, it is possible to reduce the deformation of the semiconductor chip 1 with respect to heat generation when the reverse current flows through the protection diode 4. By placing the diode regions 14 directly below the flat-plate portion 10a, it is possible to reduce the deformation of the semiconductor chip 1 due to heat generation when the reverse current flows through the protection diode 4 and when the main current flows through the switching device 2.

Stress may be applied to the joint member 20 between the semiconductor chip 1 and the flat-plate portion 10a by repeating energization of the protection diode 4 and energization of the switching element 2. Therefore, the joint by the joint member 20 may be deteriorated, and the breakdown strength may be decreased. In the reverse-conducting semiconductor devices 100 and 200, since the deformation of the semiconductor chip 1 can be reduced, a decrease in breakdown tolerance can be suppressed and reliability can be secured.

Figure 18:
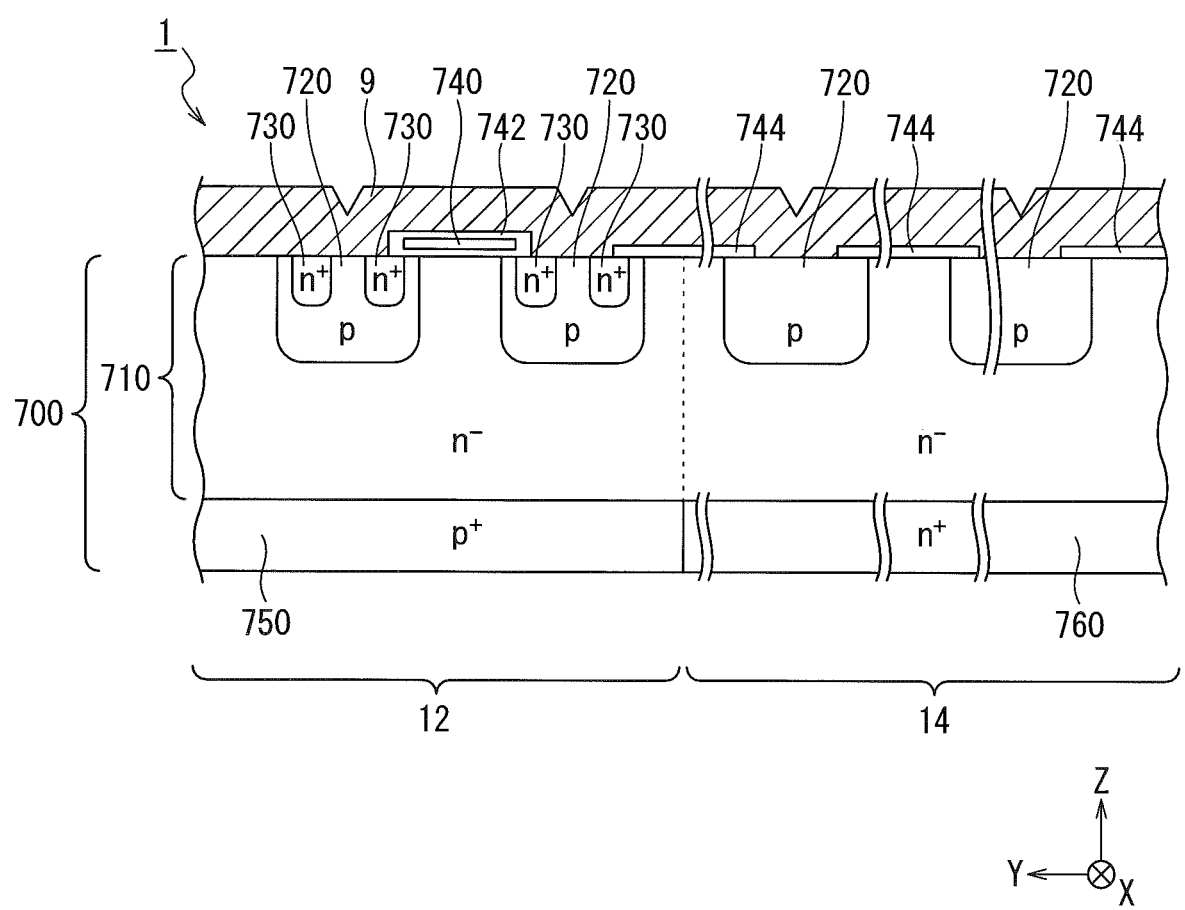
FIG. 18 is a cross-sectional view illustrating an example of the reverse-conducting semiconductor device according to the embodiment.

FIG. 18 illustrates a main part of the cross-sectional view illustrated in FIG. 2 and a structure of the active region of the semiconductor chip 1. The semiconductor chip 1 has a semiconductor substrate 700. The semiconductor substrate 700 has an $n^-$-type drift region 710 in the diode region 14. Each p-type body region 720 is provided in the drift region 710 so as to be in contact with the bottom of the upper-electrode 9. Further, in the transistor region 12, a couple of $n^+$-type emitter regions 730 are buried in each p-type body region 720 at the top surface of the semiconductor substrate 700. An edge of a gate electrode 740 is continued from an edge of the emitter regions 730 in each body region 720. An interlayer insulating film 742 covering the gate electrode 740 extends from a portion of the top surface of the emitter regions 730 in one of the body regions 720 to a portion of the top surface of the neighboring emitter region 730, which is assigned in the other p-type body region 720. In the diode region 14, a diode-region insulating film 744 is provided extending between the neighboring p-type body regions 720. The upper-electrode 9 covers entirely the top surface of the semiconductor substrate 700, the top surface of the interlayer insulating film 742, and the top surface of the diode-region insulating film 744. The upper-electrode 9 implements the emitter electrode. As illustrated in FIG. 2, the wiring member 10 is connected to the upper-electrode 9 by the joint member 20. A $p^+$-type collector region 750 is provided in the transistor region 12 in a region in contact with the bottom surface of the semiconductor substrate 700 under the drift region 710. On the other hand, in the diode region 14, an $n^+$-type cathode region 760 is provided. A lower-electrode, omitted in the figure, may be provided on the bottom surface of the collector region 750 and the cathode region 760. The structure of the active region may be a trench structure in addition to the planar structure illustrated in FIG. 18.

As illustrated in FIG. 1, the semiconductor chip 1 may be in a square-shape or a rectangular-shape in the plan view. The length of the first side 1b, that is the longer side, may be nine millimeters or more and 20 millimeters or less. The ratio of the length of the second side 1c, that is the shorter side, to the length of the first side 1b, or the longer side, may be 0.5 or more and one or less. The thickness of the chip 1 may be 60 micrometers or more and 120 micrometers or less. The width of the flat-plate portion 10a in the X-axis direction may be three millimeters or more and 12 millimeters or less. The width of the flat-plate portion 10a in the Y-axis direction may be 0.5 or more and 1.1 or less with respect to the width in the X-axis direction. The thickness of the flat-plate portion 10a may be not less than 0.2 millimeters and not more than 3 millimeters.

Other Embodiments

While the present invention has been described above by reference to the embodiment, it should be understood that the present invention is not intended to be limited to the descriptions of the specification and the drawings implementing part of this disclosure. In particular, although the RC-IGBT in which the IGBT as the switching element and the FWD for protecting the IGBT are integrated monolithically on the single semiconductor chip is exemplified as the reverse-conducting semiconductor device according to the embodiment, it is not limited to the RC-IGBT. As the reverse-conducting semiconductor device according to the embodiment, any structure in which a vertical switching element providing a main current-flow in a direction perpendicular to the principal surface of the semiconductor chip and a vertical protection diode conducting a reverse-current in a direction opposite to the main current-flow, may be used. For example, the switching element implementing the reverse-conducting semiconductor device may be a thyristor, such as a gate turn-off (GTO) thyristor, a static induction (SI) thyristor and the like.

From the above disclosure, various alternative embodiments, examples and operational techniques will be apparent to those skilled in the art. For example, it should be noted that the present invention includes various embodiments, modifications and the like, which are not described here, such as configurations arbitrarily applied to each of the configurations described in the above embodiment and each modification. Therefore, the scope of the present invention is defined only by the technical features specifying the present invention, which are prescribed by claims, the words and terms in the claims shall be reasonably construed from the subject matters recited in the present Specification.

What is claimed is:

1. A reverse-conducting semiconductor device comprising:
    a semiconductor chip having a top surface, a first side and a second side orthogonal to the first side in a plan view, in which a plurality of transistor regions and a plurality of diode regions are alternately arranged and an upper-electrode is provided above the top surface of the semiconductor chip, covering an area, in which the transistor regions and the diode regions are provided; and
    a wiring member having a flat-plate portion having a rectangular-shape, which is metallurgically jointed to the upper-electrode via a joint member above the diode regions; wherein
    the transistor regions, each of which has a stripe-shape extending in parallel to the first side in the plan view, implement main current paths for conducting main current in a direction perpendicular to the top surface of the semiconductor chip,
    the diode regions, each of which has a stripe-shape extending parallel to the first side in the plan view, implement flyback paths for conducting reverse current in a direction perpendicular to the top surface of the semiconductor chip, and
    the wiring member has a conductive wall rising from a bending edge of the flat-plate portion in a direction opposite to the upper-electrode, and the bending edge of the flat-plate portion is arranged parallel to the first side.

2. The reverse-conducting semiconductor device according to claim 1, wherein the semiconductor chip has a rectangular-shape in the plan view, and the first side is longer than the second side.

3. The reverse-conducting semiconductor device according to claim 2, wherein the flyback paths through the diode regions extends parallel to each other to sandwich a part of the main current paths through the transistor regions.

4. The reverse-conducting semiconductor device according to claim 1, wherein the conductive wall is configured to electrically connect to an external circuit.

5. The reverse-conducting semiconductor device according to claim 1, wherein all of the diode regions are covered with the flat-plate portion in the plan view.

6. The reverse-conducting semiconductor device according to claim 1, wherein an area of the diode regions covered with the flat-plate portion is 20 percent or more and 60 percent or less with respect to an area of the flat-plate portion in the plan view.

* * * * *